(12) United States Patent
Takahashi (10) Patent No.: US 11,089,697 B2
(45) Date of Patent: Aug. 10, 2021

(54) DISPLAY DEVICE

(71) Applicant: KYOCERA Corporation, Kyoto (JP)

(72) Inventor: Daisuke Takahashi, Neyagawa (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 16/769,438

(22) PCT Filed: Dec. 21, 2018

(86) PCT No.: PCT/JP2018/047158
§ 371 (c)(1),
(2) Date: Jun. 3, 2020

(87) PCT Pub. No.: WO2019/146333
PCT Pub. Date: Aug. 1, 2019

(65) Prior Publication Data
US 2020/0389985 A1 Dec. 10, 2020

(30) Foreign Application Priority Data

Jan. 24, 2018 (JP) .............................. JP2018-009370

(51) Int. Cl.
*H05K 5/00* (2006.01)
*H05K 5/02* (2006.01)

(52) U.S. Cl.
CPC ......... *H05K 5/0017* (2013.01); *H05K 5/0247* (2013.01)

(58) Field of Classification Search
None
See application file for complete search history.

(56) References Cited

U.S. PATENT DOCUMENTS

| 6,188,569 | B1 * | 2/2001 | Minemoto | G06F 1/16 |
| | | | | 312/223.2 |
| 7,466,379 | B2 * | 12/2008 | Sakata | G06F 1/1601 |
| | | | | 349/106 |
| 10,371,886 | B2 * | 8/2019 | Sugimoto | G02B 6/0088 |
| 2010/0315570 | A1 * | 12/2010 | Mathew | G06F 1/1601 |
| | | | | 349/58 |
| 2012/0056105 | A1 * | 3/2012 | Aoki | F16C 29/025 |
| | | | | 250/491.1 |
| 2013/0076704 | A1 * | 3/2013 | Song | H04N 13/10 |
| | | | | 345/204 |
| 2013/0107142 | A1 * | 5/2013 | Shirasaka | H05K 5/02 |
| | | | | 348/843 |

(Continued)

FOREIGN PATENT DOCUMENTS

JP 2002-268572 A 9/2002

*Primary Examiner* — Xanthia C Cunningham
(74) *Attorney, Agent, or Firm* — Procopio Cory Hargreaves and Savitch LLP (57) ABSTRACT

A display device in the present disclosure includes a display unit, a substrate unit and a casing. The substrate unit includes a substrate having a connector, and a holder to hold the substrate. The casing that houses the display unit and the substrate unit includes a first opening that exposes the display unit, and a second opening that exposes the connector. The substrate unit is held by at least one of a display unit lower surface and the casing, and the holder is movable in a vertical direction relative to the display unit lower surface. A clearance is present between the holder and the display unit lower surface.

8 Claims, 9 Drawing Sheets

(56) References Cited

U.S. PATENT DOCUMENTS

| | | | | |
|---|---|---|---|---|
| 2014/0063351 A1* | 3/2014 | Sato | ..................... | H04N 5/64 |
| | | | | 348/725 |
| 2014/0204275 A1* | 7/2014 | Shimizu | ............ | G02F 1/133611 |
| | | | | 348/725 |
| 2014/0218656 A1* | 8/2014 | Maruno | ............ | G02F 1/133608 |
| | | | | 349/60 |

* cited by examiner

DISPLAY DEVICE

TECHNICAL FIELD

The present disclosure relates to a display device.

BACKGROUND

Various configurations have been conventionally proposed as a display device (refer to, for example, Patent Document 1).

RELATED ART DOCUMENTS

Patent Document

Patent Document 1: Japanese Unexamined Patent Publication No. 2002-268572

SUMMARY

A display device in the present disclosure includes a display unit, a substrate unit and a casing. The substrate unit includes a substrate having a connector, and a holder to hold the substrate. The casing that houses the display unit and the substrate unit includes a first opening that exposes the display unit, and a second opening that exposes the connector. The substrate unit is held by at least one of a display unit lower surface and the casing, and the holder is movable in a vertical direction relative to the display unit lower surface. A clearance is present between the holder and the display unit lower surface.

EMBODIMENTS

<Display Device>

A display device in one of embodiments of the present disclosure is described in detail below with reference to the drawings. For the sake of description, each of the drawings referred to in the following illustrates, in a simplified form, only main members necessary for describing the embodiments. The display devices of the present disclosure are therefore capable of including any arbitrary structural member not illustrated in the drawings referred to. Dimensions of the members in each of the drawings are ones which faithfully represent neither dimensions of actual structural members nor dimension ratios of these members.

The display device 1 includes a display unit 2, a substrate unit 7 and a casing 10 in the present embodiment as illustrated in FIGS. 1 to 12.

(Display Unit)

Figure 6:
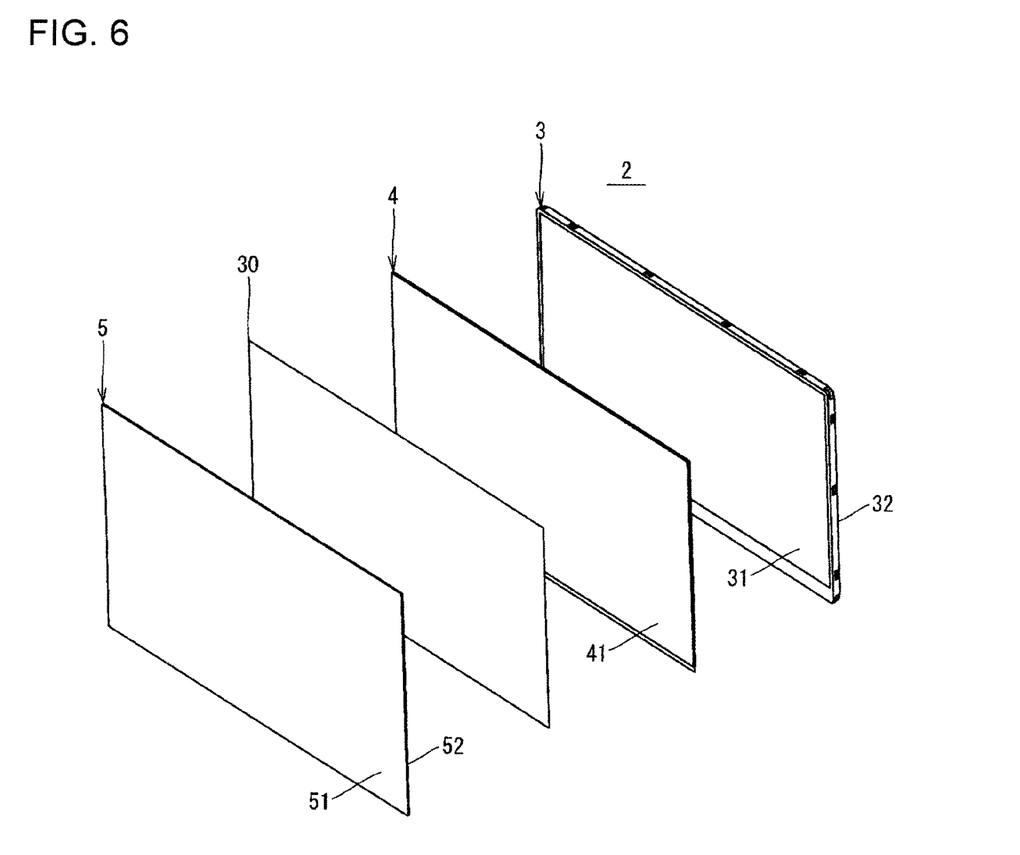
FIG. 6 is an exploded perspective view illustrating a display unit of the display device of FIG. 1.

The display unit 2 includes a function to display, for example, characters or images. As illustrated in FIG. 6, the display unit 2 includes a backlight 3, a display panel 4 located on a backlight upper surface 31, and a cover 5 located on a display panel upper surface 41 in the present embodiment. Alternatively, the display unit 2 may include a member other than the backlight 3, the display panel 4 and the cover 5.

The backlight 3 includes, for example, a function to illuminate the display panel 4. The display panel 4 is the member that performs a major role in fulfilling a function of the display unit 2. The cover 5 is the member to protect the display panel 4. For example, glass or sapphire is usable as a material of the cover 5.

The term "the upper surface" is expression for the sake of convenience, and there is no intention to indicate directivity of up and down. For example, the backlight upper surface 31 need not be a surface directed upward during use of the display device 1. This is also similarly to the lower surface described later.

The term "being located on the upper surface" is a concept including a configuration that other member is located between the member and the upper surface, besides the configuration that the member is located so as to be in contact with the upper surface. The cover 5 is located on the display panel upper surface 41 with an optical clear adhesive (OCA) 30 interposed therebetween in the present embodiment. This is also similarly to the lower surface described later.

(Substrate Unit)

The substrate unit 7 is electrically connected to the display unit 2 and includes a function to control characters or images displayed on the display unit 2. The substrate unit 7 may be electrically connected to the display unit with, for example, a connection member interposed therebetween. For example, a flexible printed circuit (FPC) is usable as the connection member. The substrate unit 7 is electrically connected to the display unit 2 with the flexible printed circuit 40 interposed therebetween in the present embodiment as illustrated in FIG. 7.

Figure 7:
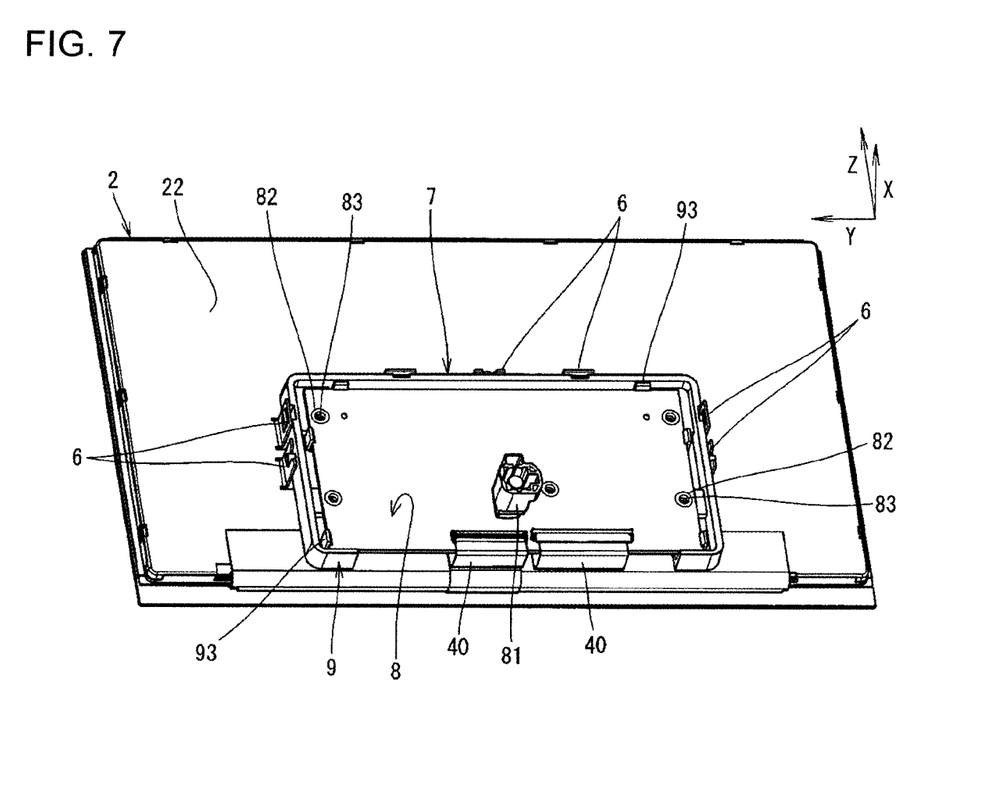
FIG. 7 is a perspective view illustrating a state where a casing is removed from the display device of FIG. 1, and a state where a substrate unit is held by a display unit lower surface.
Figure 8:
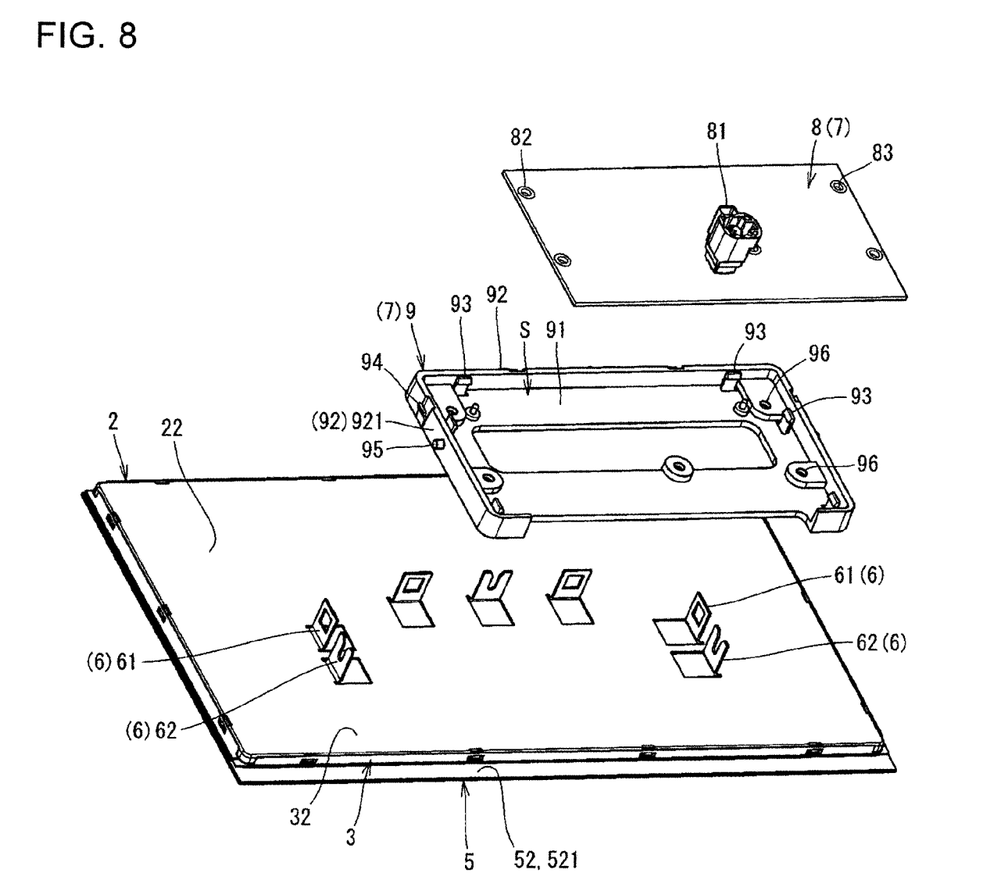
FIG. 8 is an exploded perspective view of FIG. 7.

The substrate unit 7 includes a substrate 8 and a holder 9 as illustrated in FIGS. 7 and 8. The substrate 8 is the member that performs a major role in fulfilling a function of the substrate unit 7. The substrate 8 includes a connector 81. The connector 81 is the member connecting to an external plug (not illustrated). The external plug is a plug included in the member electrically connected to the substrate 8 with the connector 81 interposed therebetween.

The holder 9 is configured to permit holding of the substrate 8 in a state where the connector 81 is exposed as illustrated in FIG. 7. As illustrated in FIG. 8, the holder 9 includes a plate-shaped bottom part 91, a sidewall part 92 connecting to the bottom part 91, and a claw part 93 located near the sidewall part 92 in the bottom part 91 in the present embodiment. The claw part 93 is formed in a hook shape lockable with the substrate 8 (refer to FIG. 7).

With the above configuration, the substrate 8 is accommodatable in a state where the connector 81 is exposed in a space S surrounded by the bottom part 91 and the sidewall part 92 as illustrated in FIGS. 7 and 8. The substrate 8 can be held by locking the claw part 93 with the substrate 8. The configuration of the holder 9 is not limited to the above configuration as long as the substrate 8 can be held in the state where the connector 81 is exposed. For example, synthetic resins are usable as a material of the holder 9. Examples of the synthetic resins include ABS (copolymers of acrylonitrile, butadiene and styrene) resins and polycarbonate resins.

(Casing)

Figure 4:
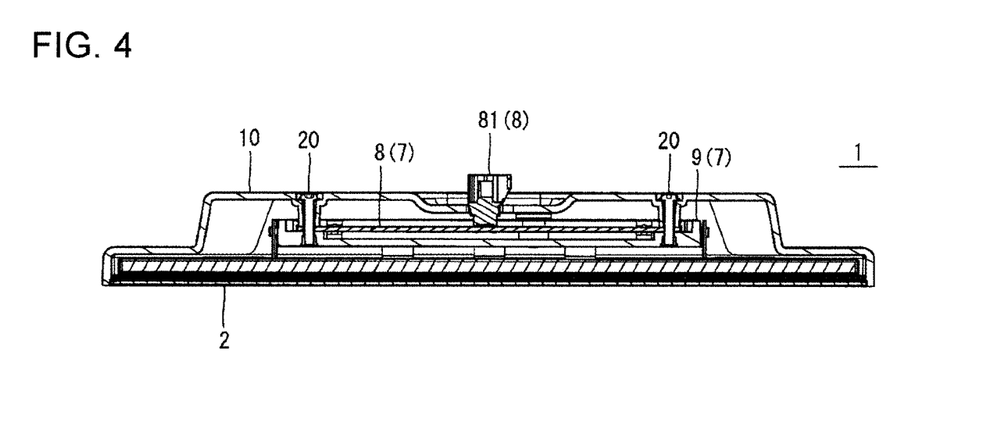
FIG. 4 is a sectional view taken along line A-A in FIG. 3.
Figure 11:
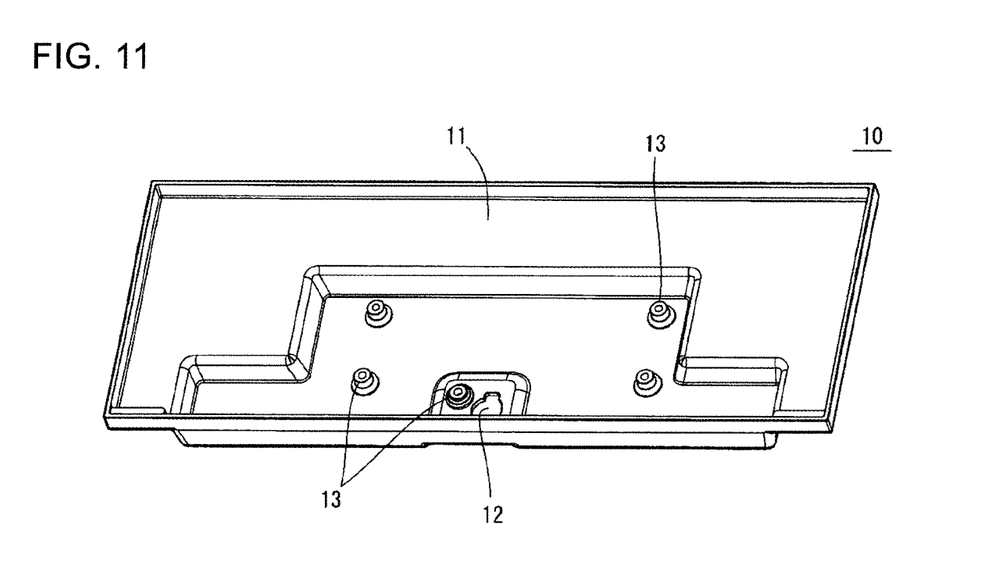
FIG. 11 is a perspective view illustrating the casing of the display device of FIG. 1.
Figure 12:
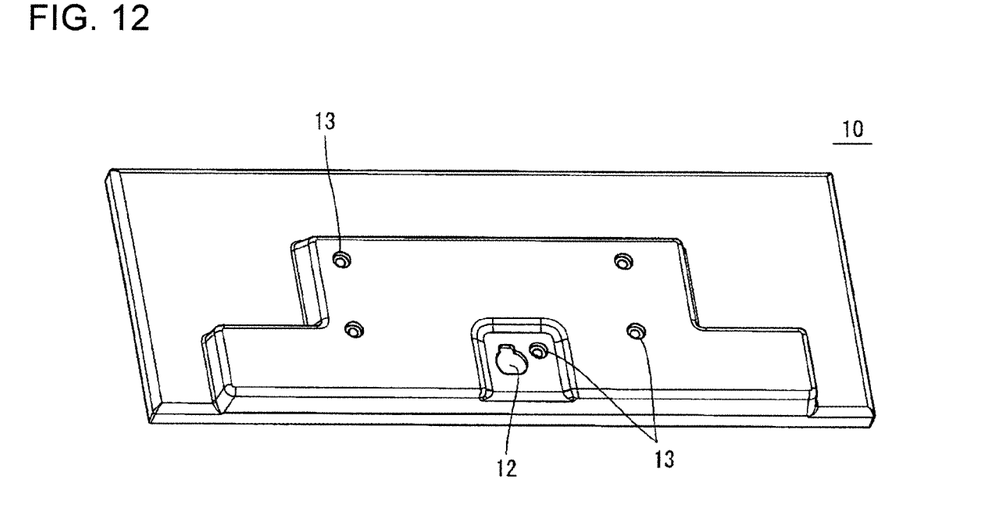
FIG. 12 is a perspective view of the casing of FIG. 11 as viewed from a different direction.

The casing 10 is configured to accommodate therein the display unit 2 and the substrate unit 7. The casing 10 includes a first opening 11 that permits insertion of the display unit 2 and the substrate unit 7, and a second opening 12 to expose the connector 81 as illustrated in FIGS. 11 and 12. The display unit 2 and the substrate unit 7 are fixed to the casing 10 in the present embodiment as illustrated in FIG. 4.

The casing 10 may be unitarily formed. If satisfying this configuration, the casing 10 is formed by a single member, thereby reducing the number of members constituting the display device 1. Alternatively, the casing 10 may be formed by a plurality of members as needed.

For example, metal is usable as a material of the casing 10. Examples of the metal includes magnesium alloys and aluminum alloys.

Figure 5:
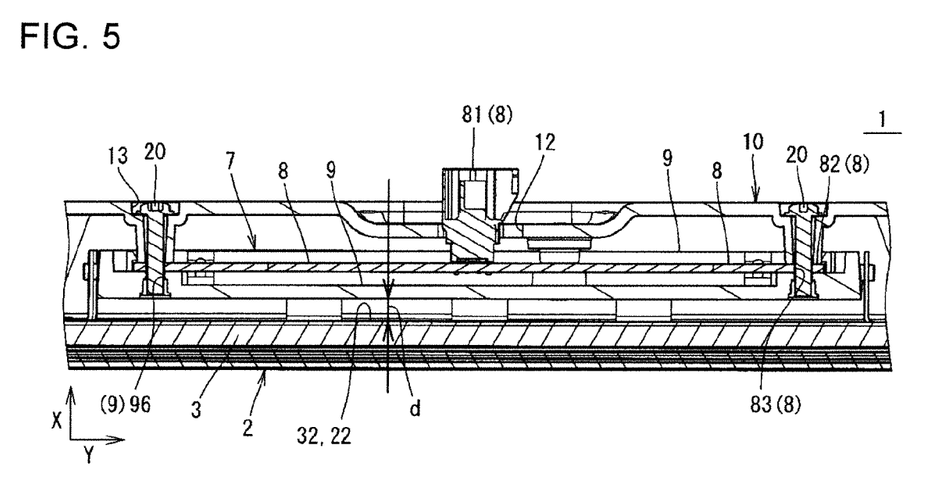
FIG. 5 is a partially enlarged view of FIG. 4.

As illustrated in FIGS. 1 to 4, the display unit 2 and the substrate unit 7 are located in the casing 10 in a state where the display unit 2 is exposed in the first opening 11 and the connector 81 is exposed in the second opening 12. As illustrated in FIGS. 7 to 10, the substrate unit 7 is held by the display unit lower surface 22 in the present embodiment in a state where the substrate 8 is held by the holder 9 and the holder 9 is held by the display unit lower surface 22 so as to be movable in a vertical direction (X direction) relative to the display unit lower surface 22 in the substrate unit 7. As illustrated in FIG. 5, a clearance "d" is present between the holder 9 and the display unit lower surface 22. The clearance "d" is present over a whole region between the holder 9 and the display unit lower surface 22.

With the above configuration, the display unit 2 is less likely to be disengaged from the casing 10 due to a pressing force exerted upon connecting the external plug to the connector 81. Specifically, a conceivable structure as the display device is, for example, a structure in which the display unit is accommodated in the casing, the display unit is fixed to the casing by an adhesive material, and the substrate is fixed to the display unit lower surface by using a screw or the like. This structure however involves the probability that the display unit may be disengaged from the casing due to a load applied in a direction in which the display unit is disengaged from the casing due to the pressing force exerted upon connecting the external plug to the connector.

Figure 9:
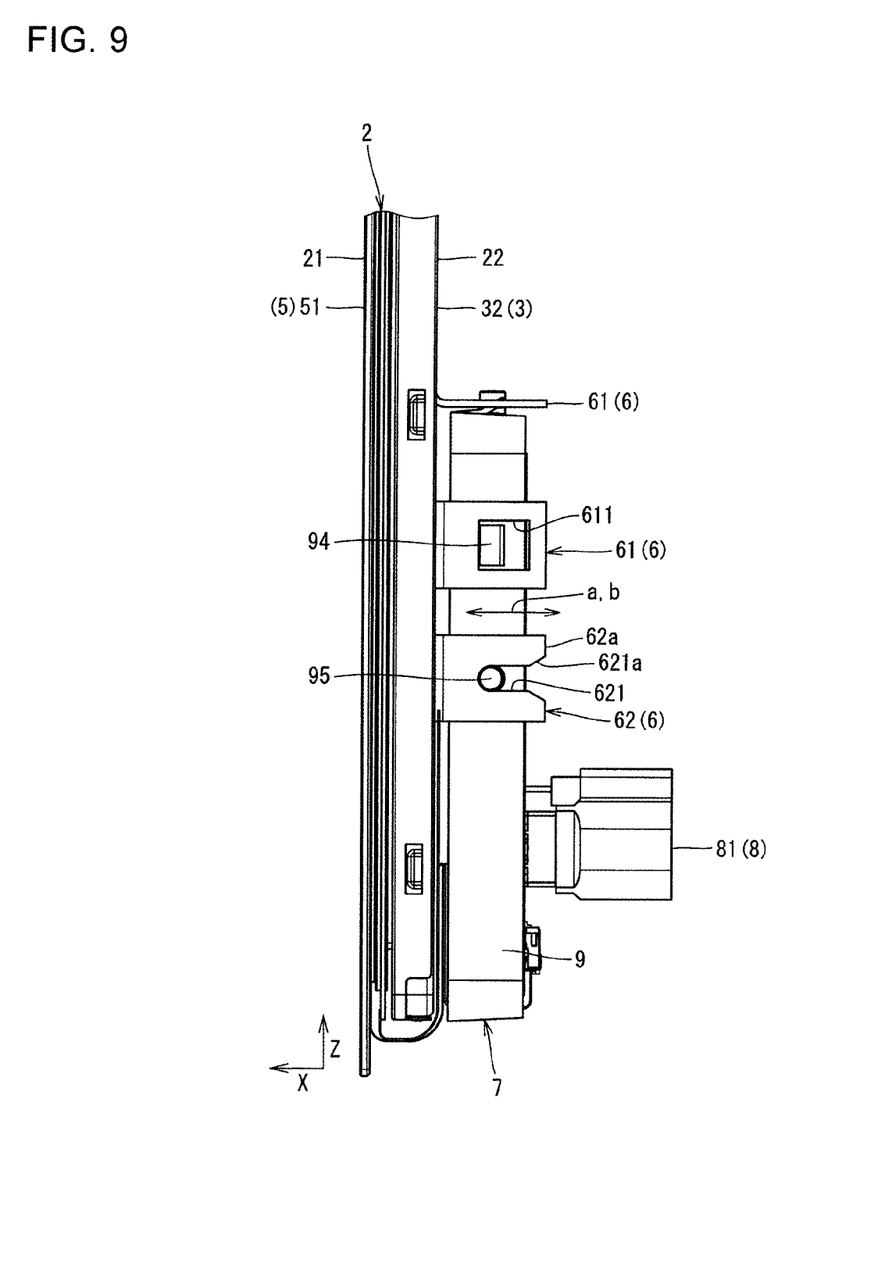
FIG. 9 is a partially enlarged view of a state where the casing is removed from the display device of FIG. 1, and a state where the substrate unit is held by a display unit lower surface, as viewed along the display unit lower surface.
Figure 10:
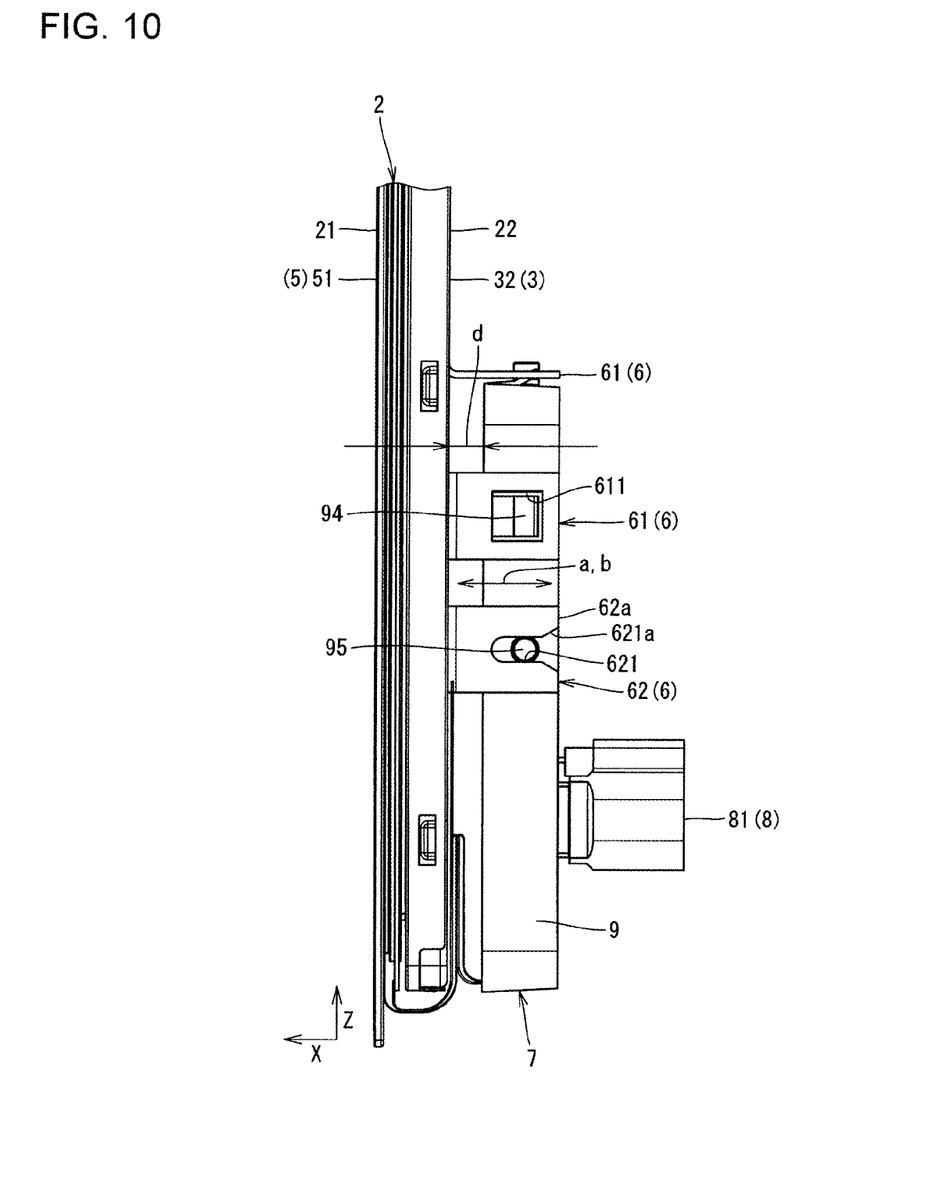
FIG. 10 is a diagram illustrating a state where a holder in FIG. 9 is moved away from the display unit lower surface.

With the display device 1, the holder 9 holding the substrate 8 is movable in the vertical direction relative to the display unit lower surface 22 as described above (refer to FIGS. 9 and 10). The holder 9 is therefore movable so as to be separated from the display unit lower surface 22 upon fixing the substrate unit 7 to the casing 10. Consequently, the substrate unit 7 is fixable to the casing 10 in a state where the clearance "d" is present between the holder 9 and the display unit lower surface 22 as illustrated in FIGS. 5 and 10. Because of the clearance "d" between the holder 9 and the display unit lower surface 22, the holder 9 is less likely to come into contact with the display unit lower surface 22 even if the holder 9 bends so as to approach the display unit lower surface 22 due to the pressing force exerted upon connecting the external plug to the connector 81. Hence, a load generated upon connecting the external plug to the connector 81 can be received by the casing 10 without being applied to the display unit 2. Thus, with the display device 1 including the above mechanism, the display unit 2 is less likely to be disengaged from the casing 10 due to the pressing force exerted upon connecting the external plug to the connector 81. The clearance "d" is not one which is unintentionally present locally between the holder 9 and the display unit lower surface 22 due to attachment accuracy of a member or distortion of the member, but one which is intentionally present over a whole region between the holder 9 and the display unit lower surface 22.

The display unit lower surface 22 is a surface which is located closest to the holder 9 among members included in the display unit 2, and which is located opposite to the holder 9. In the present embodiment, the member located closest to the holder 9 among the members included in the display unit 2 is the backlight 3, and the backlight lower surface 32 of the backlight 3 which is located facing to the holder 9 serves as the display unit lower surface 22. Hence, the clearance "d" is present between the holder 9 and the backlight lower surface 32 in the present embodiment. The clearance "d" is settable to, for example, 0.5 mm or more. Alternatively, the clearance "d" is settable to, for example, 0.5-10 mm. The clearance "d" is present over the whole region between the holder 9 and the backlight lower surface 32. The clearance "d" is not limited to the above numerical value range as long as effects thereof can be obtained.

The display unit 2 is exposed in the first opening 11 of the casing 10 as described above (refer to FIG. 1). More specifically, the display unit upper surface 21 is exposed in the first opening 11. The display unit upper surface 21 is a surface which is included in a member located most away from the holder 9 among the members included in the display unit 2, and which is the surface located on a side opposite to the display unit lower surface 22. The member located most away from the holder 9 among the members included in the display unit 2 corresponds to the cover 5, and a cover upper surface 51 of the cover 5 which is located on a side opposite to the display unit lower surface 22 corresponds to the display unit upper surface 21 in the present embodiment. The cover 5 (cover upper surface 51) is therefore exposed in the first opening 11 in the present embodiment.

As illustrated in FIGS. 7 and 8, the display unit 2 further includes a holding part 6 located on the display unit lower surface 22 and designed to hold the substrate unit 7 in the present embodiment. The holding part 6 includes a first portion 61 with a first hole 611 extended in a vertical direction relative to the display unit lower surface 22 as illustrated in FIG. 9. The first portion 61 is, for example, a plate-shaped piece (plate-shaped protrusion) disposed upright on the display unit lower surface 22. The holder 9 includes a first protrusion 94 that is protruded outward from an outer surface 921 of the sidewall part 92 and insertable into the first hole 611 in the present embodiment as illustrated in FIG. 8. With the above configurations, the first protrusion 94 is movable along a longitudinal direction "a" of the first hole 611 by being inserted into the first hole 611 as illustrated in FIG. 9. Consequently, the holder 9 is movable in the vertical direction relative to the display unit lower surface 22 as illustrated in FIGS. 9 and 10.

The holding part 6 may include a plurality of first portions 61. Similarly, the holder 9 may include a plurality of first protrusions 94. If the holding part 6 includes the plurality of first portions 61 and the plurality of first protrusions 94, their respective numbers are, for example, 2 to 6.

The first portion 61 may be formed integrally with the display unit lower surface 22. If satisfying this configuration, it is possible to improve connection strength of the first portion 61 relative to the display unit lower surface 22. Alternatively, the first portion 61 may be formed by a different member from the display unit lower surface 22 as necessary. These are also similarly to a second portion 62 described later.

Although the first hole 611 penetrates the first portion 61 in a thickness direction thereof in the present embodiment, the first hole 611 may not penetrate the first portion 61. This is also similarly to a second hole 621 described below.

The holding part 6 further includes the second portion 62 with a second hole 621 extended in a vertical direction relative to the display unit lower surface 22 in the present embodiment as illustrated in FIG. 9. The second portion 62 is, for example, a plate-shaped piece (plate-shaped protrusion) disposed upright on the display unit lower surface 22. The holder 9 includes a second protrusion 95 that is protruded outward from an outer surface 921 of the sidewall part 92 and insertable into the second hole 621 in the present embodiment as illustrated in FIG. 8. With the above configurations, it is possible to improve stability during movement of the holder 9 in the vertical direction relative to the display unit lower surface 22.

The holding part 6 may include a plurality of second portions 62. Similarly, the holder 9 may include a plurality of second protrusions 95. If the holding part 6 includes the plurality of second portions 62 and the plurality of second protrusions 95, their respective numbers are, for example, 2 to 4.

The second hole 621 opens into an end portion 62a on a side of the second portion 62 which is located away from the display unit lower surface 22 as illustrated in FIG. 9. The second hole 621 may include an enlarged width region 621a whose width in a direction vertical to the longitudinal direction "b" of the second hole 621 increases as going toward the end portion 62a. The enlarged width region 621a connects to the end portion 62a. If satisfying this configuration, it is possible to improve insertability upon inserting the second protrusions 95 into the second holes 621.

The holding part 6 includes the plurality of first portions 61 and the plurality of second portions 62, and the holder 9 includes the plurality of first protrusions 94 and the plurality of second protrusions 95 in the present embodiment. The holder 9 is fitted into the holding part 6 of the display unit lower surface 22 (refer to FIG. 7). Consequently, the holder 9 is movable not in a horizontal direction (YZ direction) but in a vertical direction (X direction) relative to the display unit lower surface 22. The configuration for holding the substrate unit 7 on the display unit lower surface 22 is not limited to the above configuration.

The display unit 2 may be held on the casing 10 by an adhesive material. If satisfying this configuration, it is easy to fix the display unit 2 to the casing 10. Examples of the adhesive material include double sided tapes and adhesives. Compositions of the double sides tapes and adhesives are not particularly limited as long as they are capable of fixing the display unit 2 to the casing 10.

The display unit 2 may be fixed to the casing 10 by the adhesive material located individually at an outer peripheral part 521 of a cover lower surface 52 and the backlight lower surface 32 (refer to FIG. 8). More specifically, an area of the cover lower surface 52 may be larger than an area of the backlight lower surface 32. The display unit 2 may be fixed to the casing 10 by the adhesive materials located individually at the outer peripheral part 521 of the cover lower surface 52 which is located more outside than the backlight lower surface 32.

The display unit 2 may be fixed to the casing 10 only by the adhesive material located on the backlight lower surface 32. If satisfying this configuration, it is possible to obtain a narrower frame that is intended to narrow a frame 1a of the display device 1 (refer to FIG. 1).

Figure 1:
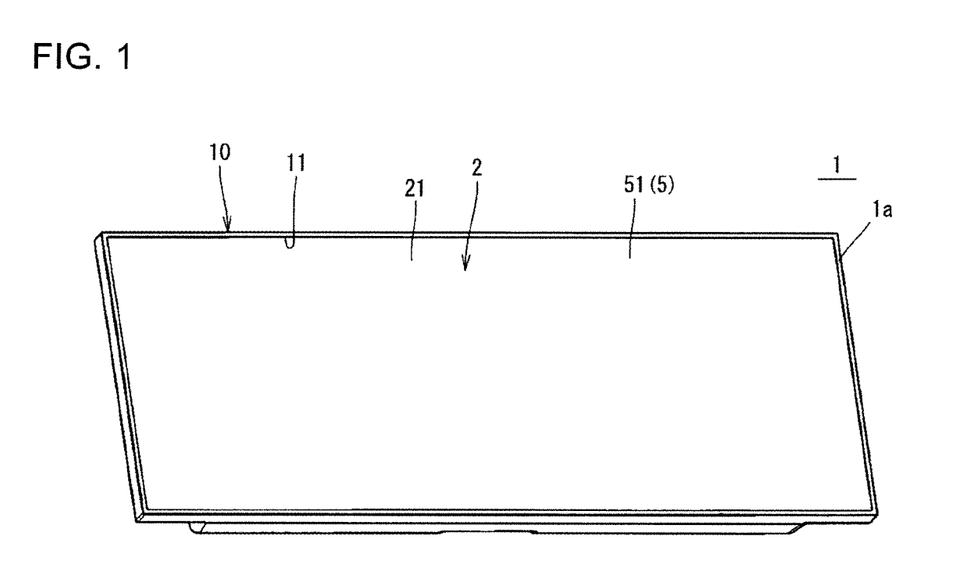
FIG. 1 is a perspective view illustrating a display device in one of embodiments of the present disclosure.
Figure 2:
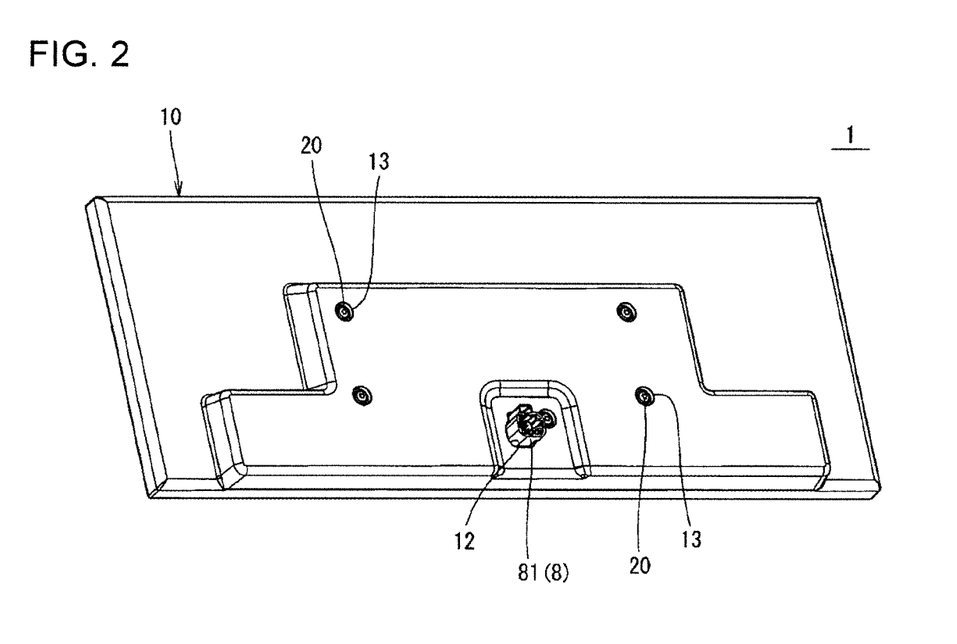
FIG. 2 is a perspective view of the display device of FIG. 1 as viewed from a different direction.
Figure 3:
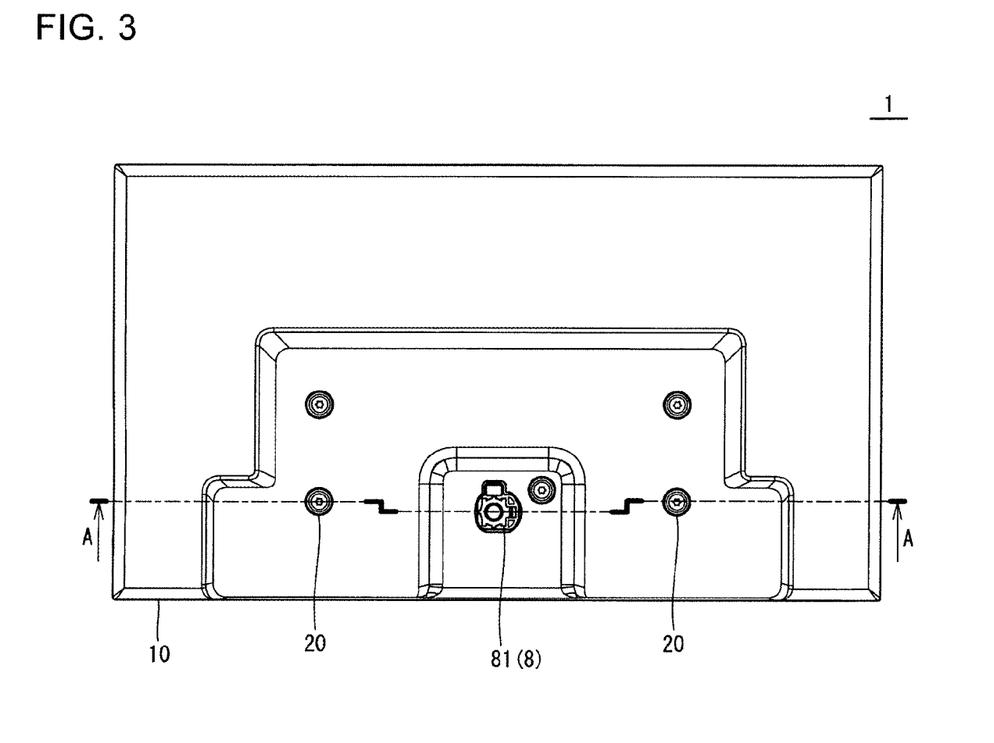
FIG. 3 is a plan view of the display device of FIG. 1 as viewed from a side of a connector.

The display device 1 may further include a screw 20 as illustrated in FIG. 2. In this case, the casing 10 may further include a through hole (first through hole) 13 which is located around the second opening 12 and permits insertion of the screw 20 as illustrated in FIGS. 11 and 12. The holder 9 may include a screw hole 96 that is exposed from the through hole 13 and permits engagement with the screw 20. The substrate unit 7 may be fixed to the casing 10 by the screw 20 externally engaged with the screw hole 96 by interposing a through hole 13 therebetween as illustrated in FIG. 5. If satisfying this configuration, the substrate unit 7 is fixable to the casing 10 with high fixing force. The holder 9 can be moved so as to go away from the display unit lower surface 22 by fastening the screw 20. That is, a dimension of the clearance "d" may be adjusted by rotation of the screw 20.

The number of each of the screw 20, the through hole 13 and the screw hole 96 may be one or a plural number. If the number of each of the screw 20, the through hole 13 and the screw hole 96 is the plural number, the number thereof is, for example, 2 to 5. This is also similarly to a through hole 83 of the substrate 8 described later.

The substrate 8 may further include a conductor part 82 as illustrated in FIGS. 7 and 8. In this case, the casing 10 may be composed of metal. The substrate 8 may be in contact with the casing 10 composed of metal with the conductor part 82 interposed therebetween (refer to FIG. 5). If satisfying these configurations, it is possible to pull out a grounding wire of the substrate 8. It is also possible to improve strength of the casing 10 because the casing 10 is composed of the metal.

Examples of material of the conductor part 82 include copper, aluminum, gold and silver.

Being composed of metal denotes being substantially composed of the metal. In other words, being composed of the metal is a concept which is not intended to limit to cases where the casing 10 is formed only by the metal, but which includes a part formed by a material other than the metal as long as effects thereof can be obtained.

The substrate 8 may further include the through hole (second through hole) 83 that permits insertion of the screw 20 as illustrated in FIGS. 7 and 8. In this case, the conductor part 82 may be located around the through hole 83. Alternatively, it may be configured to further pull out a grounding wire of the substrate 8 with the screw 20 interposed therebetween.

In a display device in other embodiment, a substrate unit 7 is designed to be held by the display unit lower surface 22 and the casing 10 in a state where the substrate 8 is held by the holder 9 and the holder 9 is movable in a vertical direction relative to the display unit lower surface 22. In this case, the holding part includes a first portion with a first hole extended from an upper surface of the casing 10 to the display lower surface 22 and extended in a vertical direction relative to these surfaces. The holder 9 includes a first protrusion which is protruded outward from an outer surface 921 of a sidewall part 92 and insertable into the first hole. That is, the first portion with the first hole is located from the upper surface of the casing 10 to the display unit lower surface 22. An alternative configuration may include a plurality of first portions each provided with the first hole, some of which are disposed on the display unit lower surface 22, and the rest are disposed on the upper surface of the casing 10. With this configuration, the first protrusion is movable along a longitudinal direction "a" of the first hole by being inserted into the first hole. The holder 9 is therefore movable in the vertical direction relative to the display unit lower surface 22. Further, with this configuration, the pressing force exerted upon connecting the external plug to the connector 81 tends to be dispersed by the pressing force's applying to both of the display units lower surface 22 and the casing 10. The display unit 2 is therefore much less likely to be disengaged from the casing 10. The display unit 2 is less likely to be bent and deformed due to a tensile force generated upon pulling the external plug from the connector 81. The display unit 2 and the substrate unit 7 are also fixed to the casing 10 in the present embodiment.

In a display device in still other embodiment, the substrate unit 7 is held by the casing 10 in a state where the substrate 8 is held by the holder 9 and the holder 9 is movable in the vertical direction relative to the display unit lower surface 22. In this case, the holding part includes a first portion with a first hole which is located on an upper surface of the casing 10 (a surface facing the substrate unit 7 and the display unit 2), and which is extended in a vertical direction from the surface. The holder 9 includes a first protrusion that is protruded outward from an outer surface 921 of the sidewall part 92 and permits insertion of the first hole. That is, the first portion with the first hole is disposed on the upper surface of the casing 10. With this configuration, the first protrusion is movable along a longitudinal direction "a" of the first hole by being inserted into the first hole. Consequently, the holder 9 is movable in the vertical direction relative to the display unit lower surface 22. Further, with this configuration, the pressing force exerted upon connecting the external plug to the connector 81 is applied only to the casing 10. This eliminates the possibility that the display unit 2 is disengaged from the casing 10. This also eliminates the possibility that the display unit 2 is bent and deformed due to a tensile force generated upon pulling the external plug from the connector 81. The display unit 2 and the substrate unit 7 are also fixed to the casing 10 in the present embodiment.

An elastic member may be disposed in the clearance "d". In this case, even if a pressing force exerted upon connecting the external plug to the connector 81 is applied to the display unit lower surface 22, the pressing force is less likely to be directly applied to the display unit lower surface 22. The elastic member may be an elastically deformable one. Examples thereof include coil-shaped springs, flat springs, and cushion materials such as sponges and polyurethane foams.

One end of the elastic member is fixed to at least one of the holder 9 and the display unit lower surface 22 by an adhesive material, double sided adhesive tape or the like. A clearance may be present between the other end of the elastic member and a portion of the holder 9 or a portion of the display unit lower surface 22 which faces the other end. In this case, even if a pressing force exerted upon connecting the external plug to the connector 81 is applied to the display unit lower surface 22, the pressing force is not applied to in an initial stage, but, from the middle, applied through the elastic member to the display unit lower surface 22. The display unit 2 is therefore much less likely to be disengaged from the casing 10.

The display device 1 including the above configurations in the present embodiment is usable for in-vehicle displays, such as a CID (Center Information Display), portable telephones, such as a smart phone, tablet terminals, portable game machines, notebook personal computers, or liquid crystal monitors. The use of the display device 1 is not limited to those as described above.

While the embodiments in the present disclosure have been exemplified above, the present disclosure is not limited to the above embodiments. It is, of course, possible to make any arbitrary ones in so far as they do not depart from the gist of the present disclosure.

For example, the display unit 2 includes the backlight 3 in the above embodiment but, alternatively, the display unit 2 may not include the backlight 3. As an example of a configuration in which the display unit 2 does not include the backlight 3, the display unit 2 includes, for example, an organic EL (Electro-Luminescence) display panel. In this case, an organic EL display panel lower surface serves as the display unit lower surface 22.

DESCRIPTION OF THE REFERENCE NUMERAL 1 display device
1a frame
2 display unit
21 display unit upper surface
22 display unit lower surface
3 backlight
31 backlight upper surface
32 backlight lower surface
4 display panel
41 display panel upper surface
5 cover
51 cover upper surface
52 cover lower surface
521 outer peripheral part
6 holding part
61 first portion
611 first hole
62 second portion
62a end portion
621 second hole
621a enlarged width region
7 substrate unit
8 substrate
81 connector
82 conductor part
83 through hole (second through hole)
9 holder
91 bottom part
92 sidewall part
921 outer surface
93 claw part
94 first protrusion
95 second protrusion
96 screw hole
10 casing
11 first opening
12 second opening 13 through hole (first through hole)
20 screw
30 optical adhesive sheet
40 flexible substrate
d clearance

The invention claimed is:

1. A display device, comprising:
a display unit;
a substrate unit comprising a substrate having a connector, and a holder to hold the substrate; and
a casing that houses the display unit and the substrate unit, the casing comprising a first opening that exposes the display unit, and a second opening that exposes the connector; wherein
the substrate unit is held by at least one of a display unit lower surface and the casing, and the holder is movable in a vertical direction relative to the display unit lower surface, and
a clearance is present between the holder and the display unit lower surface.

2. The display device according to claim 1, wherein the display unit comprises a backlight, a display panel located on a backlight upper surface, and a cover located on a display panel upper surface, and the cover is exposed in the first opening.

3. The display device according to claim 1, wherein the display unit is fixed to the casing by an adhesive material.

4. The display device according to claim 1, wherein
the display unit comprises a backlight, a display panel located on a backlight upper surface, and a cover located on a display panel upper surface, and
the display unit is fixed to the casing by an adhesive material located on an outer peripheral part of a cover lower surface and a backlight lower surface.

5. The display device according to claim 1, wherein
the display unit comprises a backlight, a display panel located on a backlight upper surface, and a cover located on a display panel upper surface, and
the display unit is fixed to the casing by an adhesive material located on a backlight lower surface.

6. The display device according to claim 1, further comprising:
a screw,
wherein
the casing further comprises a through hole adjacent to the second opening, the through hole configured to permit insertion of the screw,
the holder comprises a screw hole exposed from the through hole, the screw hole configured to engage with the screw, and
the substrate unit is secured to the casing by the screw that engages with the screw hole from an outside of the casing with the through hole interposed therebetween, and a dimension of the clearance is adjustable by rotation of the screw.

7. The display device according to claim 1, wherein
the substrate further comprises a conductor part,
the casing is composed of metal, and
the substrate is in contact with the casing with the conductor part interposed therebetween.

8. The display device according to claim 1, wherein an elastic member is disposed in the clearance.

* * * * *